United States Patent [19]

Fukuoka et al.

[11] Patent Number: 4,517,738
[45] Date of Patent: May 21, 1985

[54] METHOD FOR PACKAGING ELECTRONIC PARTS

[75] Inventors: Yoshitaka Fukuoka; Toshiaki Komine, both of Tokyo, Japan

[73] Assignee: Tokyo Shibaura Denki Kabushiki Kaisha, Kawasaki, Japan

[21] Appl. No.: 484,987

[22] Filed: Apr. 14, 1983

[30] Foreign Application Priority Data

Apr. 24, 1982 [JP] Japan .................. 57-68931

[51] Int. Cl.³ .............................. H05K 3/34
[52] U.S. Cl. ...................... 29/840; 29/458; 357/80
[58] Field of Search ............ 29/832, 840, 588, 458, 29/760; 174/52 S, 52 PE; 357/80; 219/121 L, 121 LC, 121 LD, 121 LM

[56] References Cited

U.S. PATENT DOCUMENTS

| 2,965,962 | 12/1960 | Ollendorf et al. | 29/458 |
| 3,191,268 | 6/1965 | Matea | 29/458 |
| 3,210,171 | 10/1965 | MacDonald | 219/121 LD X |
| 3,211,827 | 10/1965 | Trueb et al. | |
| 3,217,088 | 11/1965 | Steierman | 174/52 S |
| 3,485,996 | 12/1969 | Chiou et al. | 219/121 LC |
| 3,872,583 | 3/1975 | Beall et al. | 357/80 X |

FOREIGN PATENT DOCUMENTS

| 2326614 | 12/1973 | Fed. Rep. of Germany . | |
| 56-158458 | 12/1981 | Japan | 29/588 |
| 57-7042 | 3/1982 | Japan . | |

OTHER PUBLICATIONS

Japan Meeting in 1982 of Electro-Communication Institute, 2245, pp. 8-285, "Hybrid IC Type Light Receiving Module" by Tsunoda et al.
IBM Technical Disclosure Bulletin, vol. 20, No. 11B, Apr. 1978, New York, D. Crawford et al., "High Density Multilayer Ceramic Module" pp. 4771-4773.

Primary Examiner—Mark Rosenbaum
Assistant Examiner—Carl J. Arbes
Attorney, Agent, or Firm—Oblon, Fisher, Spivak, McClelland & Maier

[57] ABSTRACT

A method for hermetically packaging electronic parts such as IC chips within a space defined by a multilayer substrate and a cap is disclosed. A welding rib is formed on the printed circuit board having conductor portions so as to surround those conductor portions over which the electronic parts are to be mounted in a later step. Metal films are formed by nonelectrolytic plating on the conductor portions. A peripheral portion of a cap is placed on the welding rib. A laser beam is radiated onto the contact portion between the peripheral portion and the welding rib so as to weld them together. At this time, a portion of the welding rib which is subject to laser radiation is not covered with the metal film. Welding is thus performed in the absence of phosphorus, which is inevitably contained in the metal film formed by nonelectrolytic plating and is a principal cause of cracking at a welded portion.

11 Claims, 8 Drawing Figures

METHOD FOR PACKAGING ELECTRONIC PARTS

BACKGROUND OF THE INVENTION

I. Field of the Invention

The present invention relates to a method for packaging electronic parts such as IC chips mounted on a multilayer substrate. More particularly, the present invention relates to a method for hermetically sealing or packaging such electronic parts by laser welding within a space defined by the multilayer substrate and a cap covering it.

II. Description of the Prior Art

The demand for compact, light-weight, and highly reliable electronic equipment has been steadily increasing. In order to meet this demand, a multichip packaging technique has been developed wherein a number of electronic parts such as IC chips are mounted on a high-density multilayer substrate of alumina ceramic or the like and the entire structure is hermetically sealed. Conventional hermetic sealing techniques include encapsulation within a plastic molding by injecting a melted epoxy resin onto the multilayer substrate. However, plastic molding has the disadvantage of low humidity resistance and also does not allow preparation of a highly reliable product. In order to improve the humidity resistance, a hermetic sealing technique has been developed using a solder or low-melting point glass. However, the product of this technique has a low heat resistance.

At present, it is considered that the most reliable hermetic sealing technique is sealing by welding. According to this method, a ring-shaped welding rib is formed around an alumina ceramic multi-layer substrate on which electronic parts such as IC chips have not yet been mounted. The welding rib is made of an Fe/Ni/Co alloy or Fe/Ni alloy which has substantially the same thermal expansion coefficient as that of the substrate. A thin metal film such as an Au film is formed by electrolytic or nonelectrolytic plating to cover the entire surface of the conductor portions and the welding rib on the board so as to achieve good wire bonding characteristics of the electronic parts and to improve corrosion resistance. Then, electronic parts are mounted on some of the conductor portions of the multilayer substrate through an adhesive such as conductive epoxy resin. Subsequently, a cap is placed on the welding rib. The cap is made of the same Fe/Ni/Co alloy or Fe/Ni alloy which is used for the welding rib. The outermost shape of the cap and its measurements are substantially the same as those of the welding rib. The periphery of the cap is welded to the welding rib, thereby hermetically sealing the electronic parts within a space defined by the substrate and the cap. Welding is performed by seam welding or by laser welding.

However, seam welding has a relatively low welding power. A large cap is required when a large product is manufactured. When the large cap is used, a cap thickness must be increased to a range between 0.15 mm and 0.5 mm so as to obtain proper mechanical strength. However, since seam welding has a low welding power, it is difficult to weld such a thick cap to a corresponding welding rib. For this reason, laser welding is used when such a cap having a thickness of 0.15 to 0.5 mm is used.

As described above, the thin metal film such as an Au film is formed to cover the entire conductor portions of the multilayer substrate so as to improve wire bonding characteristics and to prevent corrosion. The thin metal film is formed by electrolytic or nonelectrolytic plating. In a product having a high packaging density, a number of floating conductors which are not connected to the external part of the board are present. When the number of floating conductors increases, it is very difficult to electrolytically plate all the floating conductors. This is because each electrode must be assigned to each floating conductor. For this reason, the thin metal film must be formed by nonelectrolytic plating in a highly integrated product.

More specifically, in the case of manufacturing a large product which has a high packaging density, a thin metal film is formed by nonelectrolytic plating on conductor portions of a multilayer substrate, and the cap periphery is welded by laser welding to the welding rib. Nonelectrolytic plating is performed by dipping the multilayer substrate which has the welding rib thereon in a nonelectrolytic plating solution. Therefore, the thin metal film is formed on the welding rib. As a result, this film is present in welding, inbetween the cap periphery and the welding rib. However, a resultant welded portion may crack over time, thereby degrading the hermetic condition of the product, and hence, its reliability.

SUMMARY OF THE INVENTION

It is, therefore, an object of the present invention to provide a method for packaging electronic parts wherein a metal film is formed by nonelectronic plating to cover the entire exposed portion of a multilayer substrate and a welding rib is welded by laser welding to a cap periphery so as not to give rise to a crack at a welded portion after welding.

Extensive studies have determined that phosphorus, which is inevitably contained in the metal film, is the cause of the cracking. Phosphorus is contained as a component added to the nonelectrolytic plating solution so as to improve adhesion between a conductor and a metal film to be adhered thereto. At present, a nonelectrolytic plating solution which provides good adhesion cannot be obtained without containing a phosphorus component.

If good welding is to be performed without phosphorus, a metal film must not be formed at a portion which is to be welded and irradiated with a laser beam. This is the fundamental principle of the method for packaging electronic parts according to the present invention.

More specifically, according to the method of the present invention, a ring-shaped welding rib is formed on a multilayer substrate having a conductor portion so as to surround the conductor portions on which electronic parts are to be mounted. Thereafter, a metal film is formed by nonelectrolytic plating to cover an entire conductor portion of the substrate. Then the electronic parts are mounted on some of the conductor portions of the substrate. A cap which has substantially the same outer shape as that of the welding rib is placed thereon. In this condition, a laser beam is radiated onto a contact portion between the welding rib and the cap periphery, thereby hermetically sealing the electronic parts within a space defined by the substrate and the cap. The crucial point of the present invention is that the metal film is not formed at a portion of the welding rib which is irradiated with the laser beam. As a result, welding can be performed in the absence of phosphorus, which is inevitably contained in the metal film formed by nonelectrolytic plating and is the cause of cracking.

The following methods can be used to prevent formation of a metal film on a laser radiation portion of the welding rib:

(A) A method in which the welding rib is covered with a mask coating such as a photoresist film, the multilayer substrate is dipped in the nonelectrolytic plating solution, and the mask coating is then removed; and (B) A method in which the metal film is formed on the welding rib and is selectively removed by grinding or selective etching.

According to the method of the present invention, substantially no cracking occurs at the welded portion since laser welding is performed in the absence of phosphorus.

DETAILED DESCRIPTION OF THE PREFERRED EMBODIMENTS

A preferred embodiment of the present invention will be described with reference to the accompanying drawings.

Figure 1:
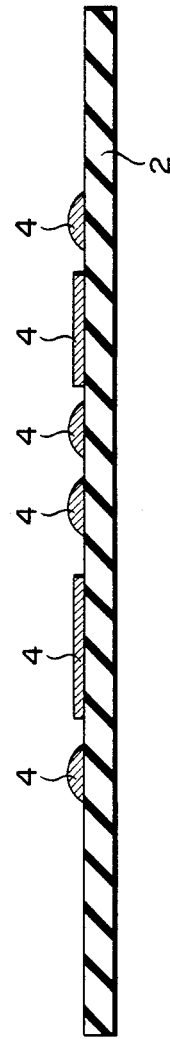
FIGS. 1 to 6 are sectional views for explaining the steps of packaging electronic parts according to a method of the present invention.

A multilayer substrate 2 having conductor portions 4 is prepared as shown in FIG. 1. The multilayer substrate 2 is made of, for example, an alumina ceramic. Such a multilayer substrate is well known in this field, and a detailed description thereof will be omitted.

Figure 2:
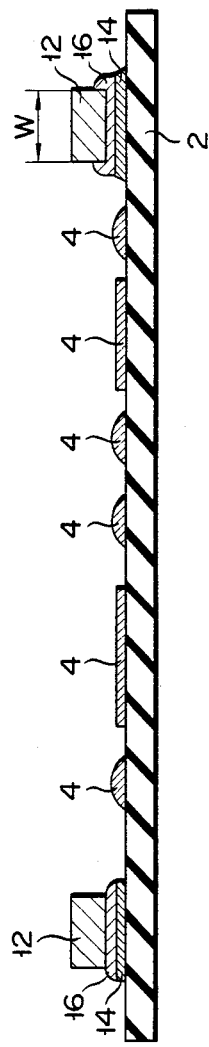

As shown in FIG. 2, a ring-shaped welding rib 12 which surrounds the conductor portions on which electronic parts are later to be mounted is formed on the substrate 2 in the same manner as in the prior art. The welding rib 12 preferably consists of an Fe/Ni/Co alloy (53.6% by weight of Fe, 29% by weight of Ni, 17% by weight of Co, 0.3% by weight of Mn, and 0.1% by weight of Si) or an Fe/Ni alloy (58% by weight of Fe and 42% by weight of Ni) which has substantially the same thermal expansion coefficient as that of the alumina ceramic which constitutes the multilayer substrate 2. The welding rib 12 is generally adhered on a ring-shaped conductor pattern 14 through an adhesive layer 16 of silver copper eutectic alloy or the like so as to connect a cap (which will be welded to the welding rib 12 in the subsequent step) to the multilayer substrate 2 in the subsequent process, thereby grounding the cap. However, if the cap need not be grounded, the welding rib 12 may be formed directly on the multi-layer substrate 2. The term "ring-shaped" used herein broadly indicates any closed loop such as a square, rectangular, or polygonal loop.

Figure 3:
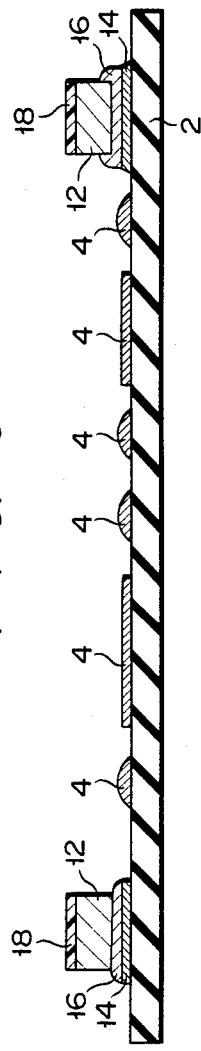

According to an embodiment of the present invention, as shown in FIG. 3, a portion of the welding rib 12, which extends along the entire circumference of the welding rib 12 and which is to be irradiated with a laser beam, is covered with a mask coating 18 of non-metallic material such as a photoresist film. The entire top surface of the welding rib 12 is preferably and easily covered with the mask coating 18 which is formed on the top surface of the welding rib 12 by applying a photoresist material thereto.

Figure 4:
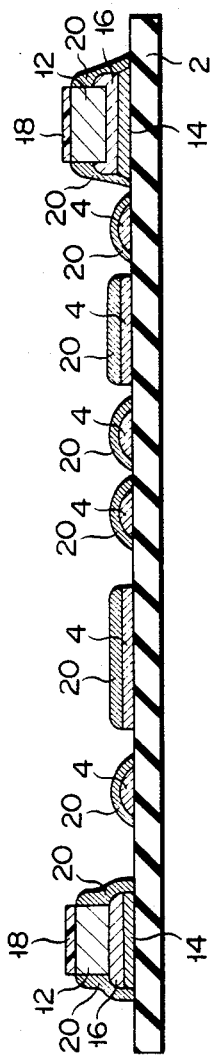

The obtained structure is then dipped in a nonelectrolytic plating solution, so that the conductors 4 are covered with a metal film 20, as shown in FIG. 4. The metal film 20 is formed to improve the bonding strength of the wires and to improve corrosion resistance. In general, the metal film 20 includes a first metal layer of Ni, Ti or Cr and has a thickness of, for example, 2 to 3 $\mu$m and a second metal layer formed on the first metal layer. The second metal layer usually consists of Au, Ag, Pd or Pt and has a thickness of, for example, about 1.5 $\mu$m. The first layer serves as an adhesive layer for adhering the second layer to the conductors 4. After the entire structure is dipped in a first nonelectrolytic plating solution to form the first metal layer, the resultant structure is then dipped in a second nonelectrolytic plating solution to form a second metal layer. The formation of the metal film 20 by nonelectrolytic plating is well known to those who are skilled in the art, and a detailed description thereof will be omitted. The mask coating 18 is not a metal film, so the metal film 20 may not be formed thereon.

Figure 5:
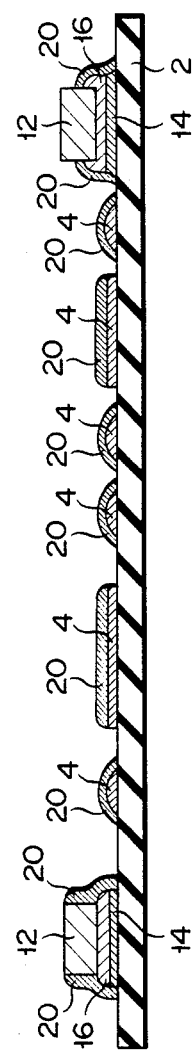

As shown in FIG. 5, the mask coating 18 is then removed. When the photoresist film is used as the mask coating 18, the photoresist film may be easily removed by washing it with a developer or a parting agent thereof. By the removal of the mask coating 18, a region which is not covered with the metal film 20 is provided on the welding rib 12.

Figure 6:
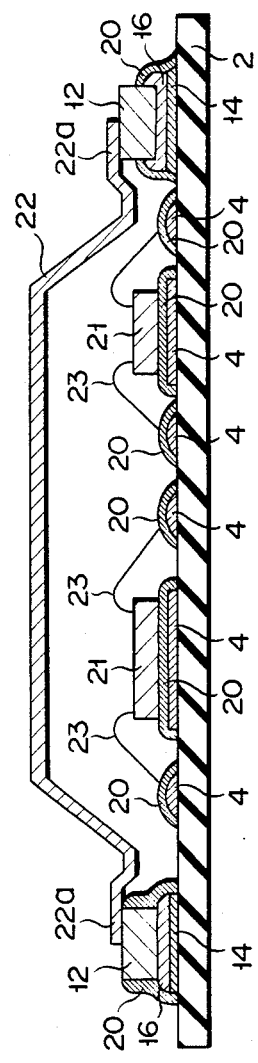

As shown in FIG. 6, after mounting electronic parts 21 over some of the conductors 4 through an adhesive such as a conductive epoxy resin and connecting them to some of the other conductors 4 through connecting leads 23, a cap 22 having substantially the same outer shape as that of the welding rib 12 is mounted on the welding rib 12 such that the peripheral portion 22a of the cap 22 is placed on the region of the welding rib 12 which is not covered with the metal film 20. The phrase "substantially the same outer shape as that of the welding rib 12" means that when the welding rib 12 has, for example, a rectangular shape, the peripheral portion 22a of the cap has substantially the same rectangular shape and size. The cap 22 is preferably formed of the Fe/Ni/Co alloy or the Fe/Ni alloy which has the same thermal expansion coefficient as that of the alumina ceramic of the multilayer substrate 2.

Figure 7:
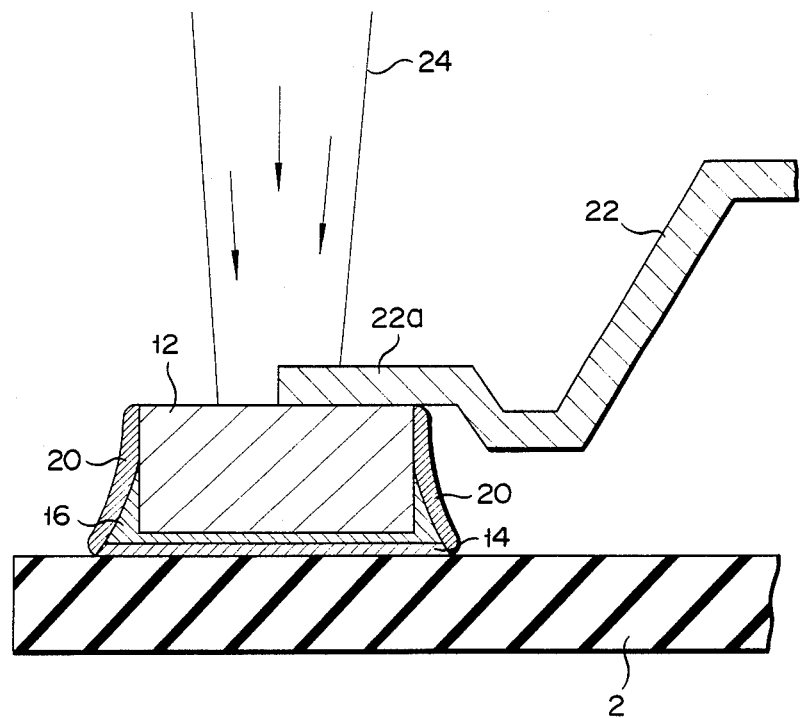
FIGS. 7 and 8 are enlarged sectional views of a welded portion.

As shown in FIG. 7, a laser beam 24 is radiated onto a contact portion between the exposed surface of the welding rib 12 and the peripheral portion 22a of the cap 22 so as to weld the welding rib 12 and the peripheral portion 22a together. The electronic parts 21 are thus hermetically sealed within a space defined by the multilayer substrate 2 and the cap 22. This laser welding step can be performed in the same manner as conventional laser welding, and a detailed description thereof will be omitted. In general, a YAG laser having a power of, for example, 5 to 10 Joules/pulse and a beam spot diameter of, for example, about 1 mm is used. The substrate 2 is put on an X-Y table and the X-Y table is moved by a widely used micro computer-regulated X-Y table controller, so that the entire peripheral portion 22a of the cap 22 is welded to the ring-shaped welding rib 12 by the fixed laser beam 24.

Figure 8:
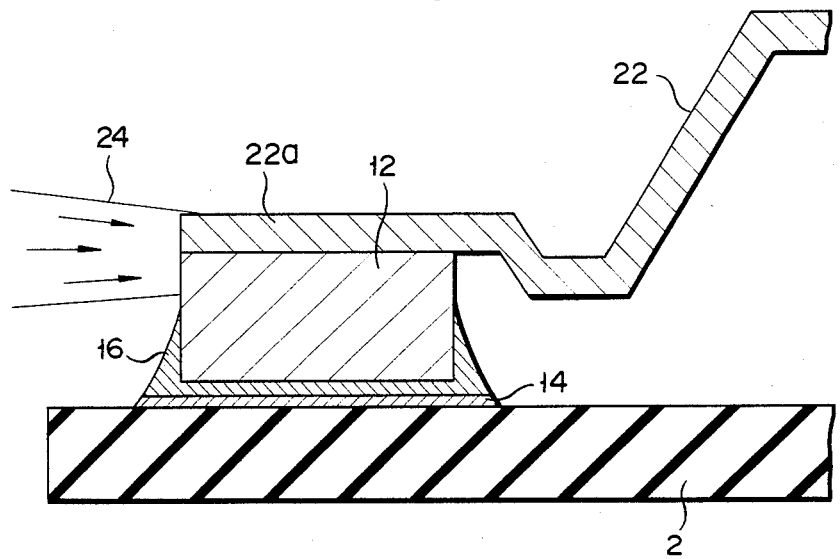

In the method described above, the mask coating 18 may be formed on the outer side surface of the welding rib 12 as well as on its top surface. The metal film 20 may then not be formed on either the outer side surface or the top surface of the welding rib 12. In this case, as shown in FIG. 8, the end face of the peripheral portion 22a and the outer side surface of the welding rib 12 are made flush, so that the laser beam 24 may be radiated onto the end face of the peripheral portion 22a and the outer side surface of the welding rib 12. Also, the mounting of electronic parts may be carried out before the removal of the mask coating 18.

According to another preferred embodiment of the present invention, after the ring-shaped welding rib 12 is formed as shown in FIG. 2, the resultant structure is dipped in the nonelectrolytic plating solution without previously forming the mask coating 18 on the welding rib 12, thereby forming the metal film 20. In this case, the metal film 20 is also formed on the entire surface of the welding rib 12.

A portion of the metal film 20 on the welding rib 12, which extends along the entire circumference of the welding rib 12 and which is to be subjected to laser beam radiation is then removed. Thus, a region of the welding rib 12 which is not covered with the metal film 20 is provided. It is easiest and most convenient to remove the metal film 20 from the entire top surface of the welding rib 12. The removal of the metal film 20 from the top surface can be performed by grinding; the metal film on the top surface of the welding rib 12 is simply urged against a rotating grinder. Alternatively, a mask coating such as a photoresist film can be formed on the region of the metal film other than the portion to be removed, and the exposed metal film portion alone can be etched. Grinding is easier than and preferable to selective etching.

When the metal film portion on the welding rib 12 has been removed, the resultant structure is the same as that shown in FIG. 5. The subsequent process is the same as that in the first embodiment, as described above. In this case, again, the mounting of the electronic parts may be carried out before the removal of the metal film 20 on the welding rib 12.

A width W (see FIG. 2) of the welding rib 12 is preferably set as follows:

$$W \geq (2YL/100) + D$$

where Y is a difference (%) between the actual outer measurement of the multilayer substrate after sintering and the preset outer measurement (the multilayer substrate is generally formed by sintering an alumina tape, and the substrate is thermally contracted by sintering), L is the outer measurement of the cap, and D is the spot diameter of the laser beam. When the width W of the welding rib 12 is preset as described above, the end face of the cap peripheral portion 22a is located on the portion of the welding rib 12, which is defined by the line at a distance of D/2 from the inner side surface of the welding rib 12 and the line at a distance of D/2 from the outer side surface of the welding rib 12, even if the multilayer substrate contracts within a range of ±Y% with respect to the preset size of the substrate. As a result, good hermetic sealing can be obtained by vertically radiating the laser beam onto the contact portion.

EXAMPLE

A conductor pattern was formed around an alumina ceramic multilayer substrate which had conductor portions and was 3×3 inches in size. A welding rib was formed on the conductor pattern through an adhesive layer of silver copper eutectic alloy. The welding rib was made of an Fe/Ni/Co alloy (53.6% by weight of Fe, 29% by weight of Ni, 17% by weight of Co, 0.3% by weight of Mn, and 0.1% by weight of Si) and had a width of 3 mm and a height of 0.75 mm. The resultant structure was dipped in a nonelectrolytic plating solution for Ni plating so as to form an Ni layer of 2 to 3 μm thickness on the conductor portions and on the surfaces of the welding rib. Thereafter, the resultant structure was dipped in a nonelectrolytic plating solution for Au plating. An Au layer was formed on the Ni layer to a thickness of about 1.5 μm. The Au and Ni layers on the entire top surface of the welding rib were then removed by urging it against a rotating grinder. Thus, the top surface of the welding rib was completely exposed. Thereafter, IC chips were mounted over some of the conductor portions through an electroconductive epoxy resin. A peripheral portion of the cap of the Fe/Ni/Co alloy (the same as that used for the welding rib) having a thickness of 0.25 to 0.3 mm was then placed on the welding rib. In this condition, a laser beam which had a power of 7 Joules/pulse and a beam spot diameter of 1 mm was radiated onto a contact portion between the cap peripheral portion and the welding rib, thereby hermetically welding the peripheral portion of the cap and the welding rib together. In this manner, the IC chips were hermetically sealed within a space defined by the multilayer substrate and the cap. The welding operation was performed in an He atmosphere, so that He gas was sealed in the space defined by the multilayer substrate and the cap.

As a control, IC chips were packaged according to the conventional method. The IC chips were hermetically sealed in the same manner as in the example of the present invention except that the Au and Ni layers on the top surface of the welding rib were not eliminated.

An He leak test which has been widely carried out in this field was made so as to examine the hermetic sealing at the welded portion. The He leakage of the product manufactured by the method of the present invention was measured to be $10^{-9}$ to $10^{-10}$ atom·ml/sec. A service life of over 10 years was guaranteed according to the product of the present invention. However, the He leakage of the product manufactured by the conventional method was measured to be a value in excess of $10^{-6}$ atm·ml/sec, so the actual leakage could not be accurately measured by an He leak detector.

Furthermore, when the welded portion of the product manufactured by the method of the present invention was observed by a microscope, no crack was found at the welded portion. However, a plurality of cracks were observed in the product manufactured by the conventional method.

What we claim is:

1. A method for packaging electronic parts, comprising the steps of:
    forming a ring-shaped welding rib on a multilayer substrate having conductor portions so as to surround those conductor portions over which the electronic parts are to be mounted in a later step;
    forming a nonmetallic mask coating on a portion of the welding rib which is subjected to laser radiation in a subsequent step and which extends along the entire circumference of the welding rib;
    forming metal films by nonelectrolytic plating on the exposed portion of the welding rib and on the conductor portions;
    removing the mask coating, thereby providing a portion of the welding rib which is not covered with the metal film;
    mounting the electronic parts on the metal films on some of the conductor portions;

mounting a cap on the welding rib such that a peripheral portion of the cap is placed on the portion of the welding rib which is not covered with the metal film, the cap having an outer shape substantially the same as the welding rib; and radiating a laser beam on the contact portion between the welding rib and the peripheral portion of the cap to weld the welding rib and the peripheral portion together, thereby hermetically sealing the electronic parts within a space defined by the multi-layer substrate and the cap.

2. The method according to claim 1, wherein the welding rib is fixed on a ring-shaped conductor pattern through an adhesive layer, the ring-shaped conductor pattern being formed on the multilayer substrate.

3. The method according to claim 1, wherein the mask coating consists of a photoresist film.

4. The method according to claim 1, wherein the mask coating is formed to cover the entire top surface of the welding rib.

5. A method for packaging electronic parts, comprising the steps of:

forming a ring-shaped welding rib on a multilayer substrate having conductor portions so as to surround those conductor portions over which the electronic parts are to be mounted in a later step;

forming a metal film by nonelectrolytic plating to cover the conductor portions and the entire surfaces of the welding rib;

removing a portion of the metal film on the welding rib, which extends along the entire circumference of the welding rib and which is subjected to laser radiation in a subsequent step, thereby providing an exposed portion of the welding rib which is not covered with the metal film;

mounting the electronic parts on the metal films on some of the conductor portions;

mounting a cap on the exposed portion of the welding rib such that a peripheral portion of the cap is placed on the exposed portion, the cap having substantially the same outer shape as the welding rib; and radiating a laser beam on the contact portion between the welding rib and the peripheral portion of the cap to weld the welding rib and the peripheral portion together, thereby hermetically sealing the electronic parts within a space defined by the multi-layer substrate and the cap.

6. The method according to claim 5, wherein the welding rib is fixed on a ring-shaped conductor pattern through an adhesive layer, the ring-shaped conductor pattern being formed on the multilayer substrate.

7. The method according to claim 5, wherein the metal film formed on the top surface of the welding rib is completely eliminated.

8. The method according to claim 7, wherein the metal film is removed by grinding.

9. The method according to claim 8, wherein the metal film is removed by being urged against a rotating grinder.

10. The method according to claim 5, wherein the step of removing the metal film is carried out by covering with a mask coating a portion of the metal film other than the portion to be removed, and etching off the exposed portion of the metal film.

11. The method according to claim 10, wherein the mask coating consists of a photoresist film.

* * * * *